United States Patent
Yang et al.

Patent Number: 5,973,353
Date of Patent: *Oct. 26, 1999

[54] METHODS AND ARRANGEMENTS FOR FORMING A TAPERED FLOATING GATE IN NON-VOLATILE MEMORY SEMICONDUCTOR DEVICES

[75] Inventors: Wenge Yang, Fremont; Lewis Shen, Cupertino, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/992,951
[22] Filed: Dec. 18, 1997
[51] Int. Cl.$^6$ .................................................. H01L 29/788
[52] U.S. Cl. ........................ 257/315; 257/317; 257/508
[58] Field of Search ..................................... 257/314, 315, 257/317, 346, 407, 387, 508; 438/257, 266

[56] References Cited

U.S. PATENT DOCUMENTS

| | | | |
|---|---|---|---|
| 5,021,848 | 6/1991 | Chiu | 257/317 |
| 5,432,112 | 7/1995 | Hong | 438/593 |
| 5,508,957 | 4/1996 | Momodomi et al. | 365/185.17 |
| 5,830,771 | 11/1998 | Fukatsu et al. | 437/43 |

*Primary Examiner*—Jerome Jackson, Jr.
*Assistant Examiner*—George C. Eckert, II

[57] ABSTRACT

Methods and arrangements are provided to increase the process control during the fabrication of the floating/control gate configuration in a non-volatile memory semiconductor device. The methods and arrangements effectively reduce the severity of the topology attributable to the space between adjacent floating gates by advantageously tapering the sidewalls of the floating gates. The altered topology allows a subsequently formed control gate to be formed without significant surface depressions. Significant surface depressions in the control gate can lead to cracks in the suicide layer that is formed on the control gate. The cracking usually occurs during subsequent thermal processing of the semiconductor device. Thus the disclosed methods and arrangements prevent cracking of the silicide layer on the control gate, which can affect the performance of the semiconductor device by increasing the resistance of the control gate arrangement.

11 Claims, 5 Drawing Sheets

//<sub>1</sub>//

METHODS AND ARRANGEMENTS FOR FORMING A TAPERED FLOATING GATE IN NON-VOLATILE MEMORY SEMICONDUCTOR DEVICES

TECHNICAL FIELD

The present invention relates to semiconductor devices and manufacturing processes, and more particularly to methods and apparatus associated with non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a suicide layer 28, which acts to increase the electrical conductivity of control gate 26. Silicide layer 28 is typically a tungsten suicide (e.g., WSi$_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxide regions 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as a oxide-nitride-oxide (ONO) layer.

The continued shrinking of the memory cells, and in particular the features depicted in the memory cells of FIGS. 1a–b, places a burden on the fabrication process to deposit/form the floating gate 16 and control gate 26 without creating deleterious effects within the memory cell. Of particular concern caused by the shrinking dimensions is the need to provide adequate isolation between each of the floating gates 16a–c, and between each of the floating gates 16a–c and control gate 26, while also providing an adequately arranged floating/control gate configuration.

SUMMARY OF THE INVENTION

These needs and others are met by the present invention, which provides methods and arrangements that increase the process control during the fabrication of semiconductor devices, and in particular, during the formation of the floating/control gate configuration in a non-volatile memory semiconductor device. In accordance with one aspect of the present invention, it has been found that in certain semiconductor arrangements, the topology created by the space between adjacent floating gates (e.g., 16a and 16b can be so severe in shape (e.g., deep and narrow) that the suicide layer 28 formed on the overlying control gate 26 often contains significant depressions over the space. These significant depressions can lead to cracks in the silicide layer 28 during subsequent thermal processing of the semiconductor device, which tends to stress the suicide layer 28.

In accordance with one aspect of the present invention, the shape of the open spaces located between floating gates following patterning is altered by tapering the sidewalls of the floating gate. The resulting topology is, therefore, not as severe as it typically would be with a conventional floating gate having significantly perpendicular sidewalls. The modified topology improves the step coverage of both the control gate material and silicide material, and thereby does not cause significant depressions to form in the subsequently formed silicide layer 28. Consequently, cracking of silicide layer 28 is substantially less likely to occur during the subsequent thermal processes.

Thus, in accordance with certain embodiments of the present invention, a method, and an associated arrangement, are provided. The method includes the steps of forming at least two isolating regions, separated by an isolated region, within a substrate and forming a floating gate over the substrate and a portion of at least one of the isolating regions, wherein the floating gate has tapered sidewalls.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
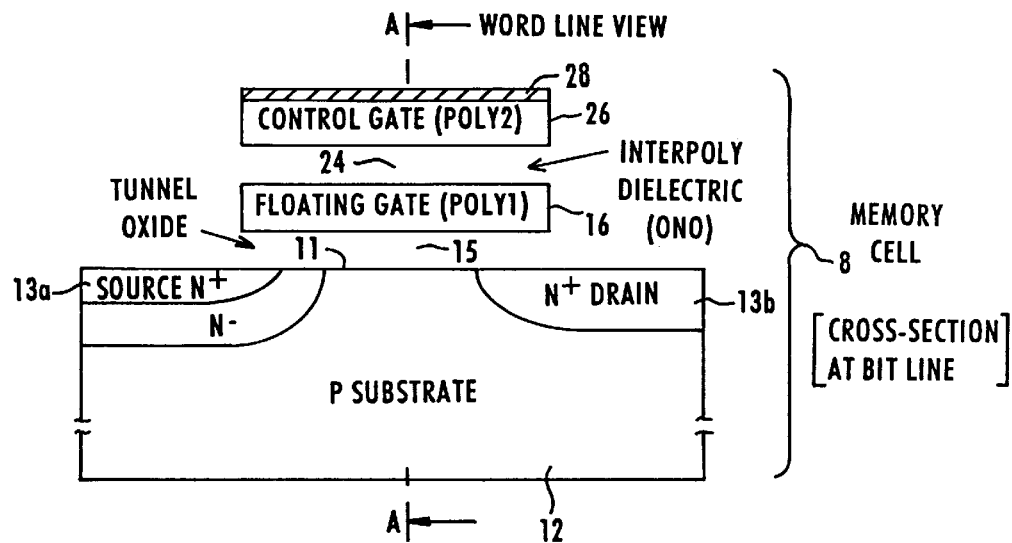
FIGS. 1a–b depict different cross-sectional views of portions of a typical prior art semiconductor device having at least one memory cell.
Figure 1B:
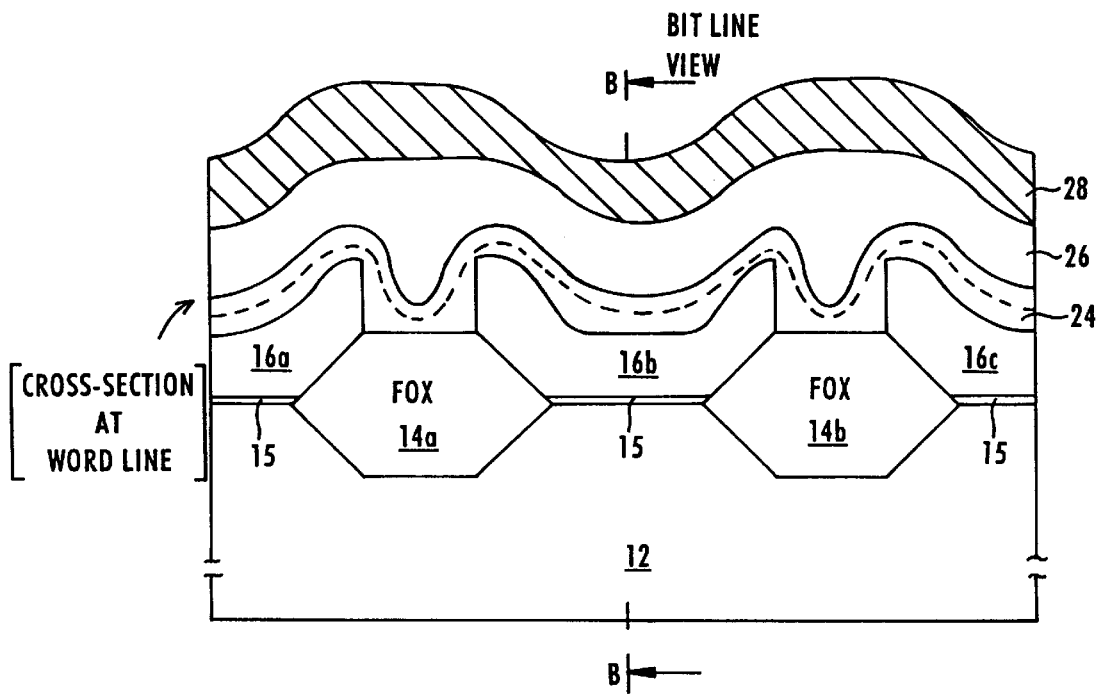
Figure 2A:
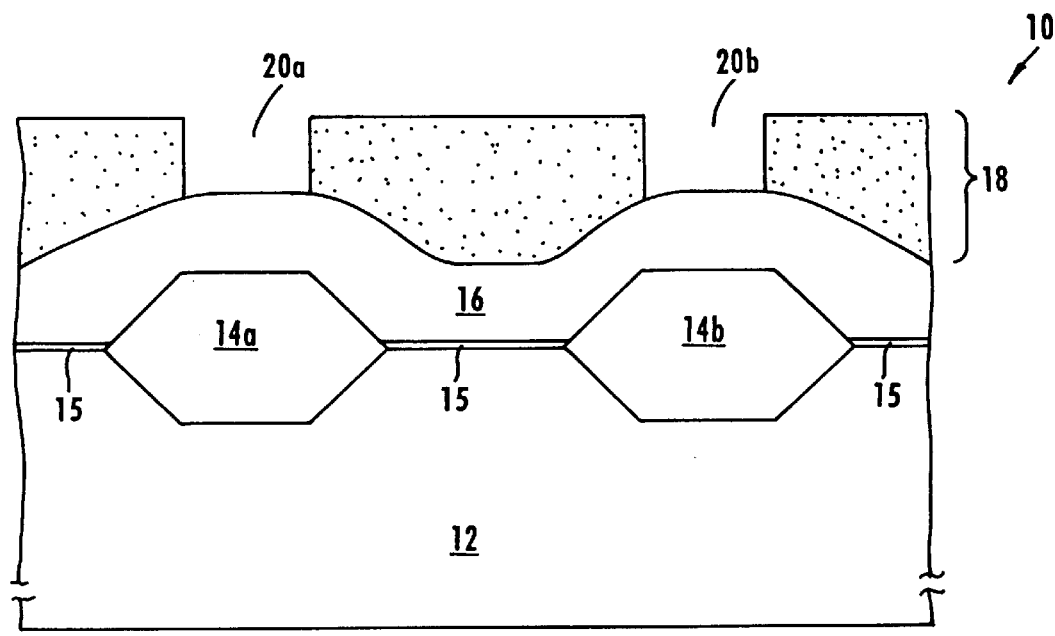
FIGS. 2a–2e sequentially depict cross-sectional views of a portion of a semiconductor device during the formation of a plurality of memory cells, which results in at least one of the memory cells having a control gate arrangement with a damaged or cracked silicide layer.

FIG. 2a represents a portion 10 of a semiconductor device as viewed from a cross-sectional perspective through the word line (similar to FIG. 1b). Portion 10, in FIG. 2a, depicts the formation of floating gates 16a–c from at least one layer of polysilicon. As shown, a conformal polysilicon layer 16 has been formed over substrate 12, tunnel oxide 15, and field oxides 14a–b. Polysilicon layer 16 can be deposited, for example, using conventional deposition techniques, such as, chemical vapor deposition (CVD) or plasma enhanced CVD (PECVD) techniques. To pattern polysilicon layer 16 into floating gates 16a–16c (see FIG. 2b) a mask 18 has been formed and patterned on polysilicon layer 16. Mask 18, which is typically a lithographic mask, includes openings 20a–20b that selectively expose portions of the underlying polysilicon layer 16. The formation of floating gates 16a–16c includes anisotropic etching, such as certain reactive ion etching (RIE) or plasma etching processes that remove the exposed portions of polysilicon layer 16 through openings 20a–b, and stop on field oxides 14a–b.

Figure 2B:
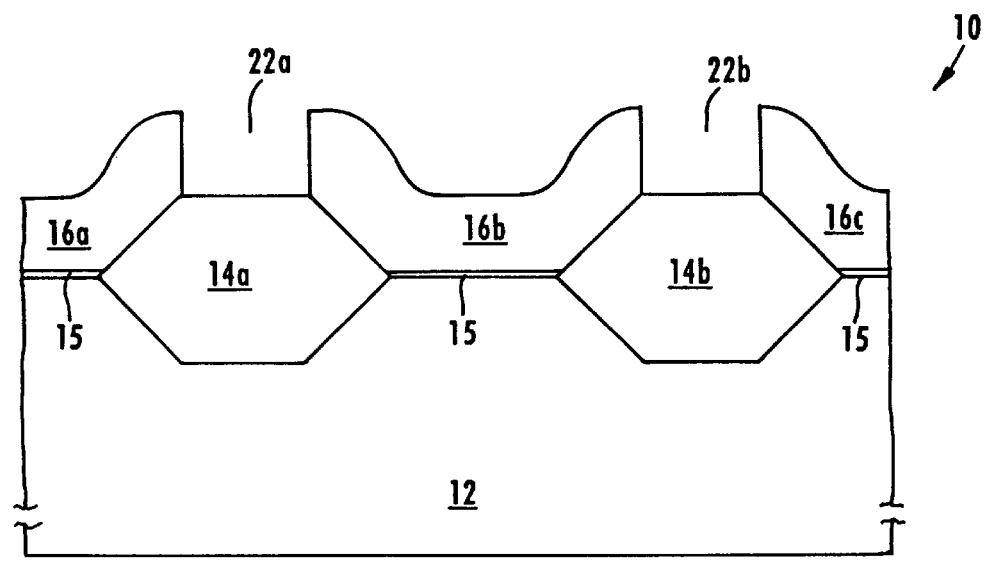

In FIG. 2b, portion 10 has been etched and mask 18 has been stripped away, for example, using conventional stripping techniques, leaving floating gates 16a–c. The etching process creates spaces 22a and 22b. Spaces 22a–22b tend to be relatively narrow in width. For example, in sub-micron flash memories, spaces 22a and 22b can be between about 0.1 and 0.4 microns. Floating gates 16a–c are typically about 900 to 1,100 Angstroms thick. Consequently, the critical dimension of spaces 22a–b represents a significantly severe topology over which the subsequent layers are formed (e.g., interpoly dielectric layer 24, control gate 26 and silicide layer 28).

Figure 2C:
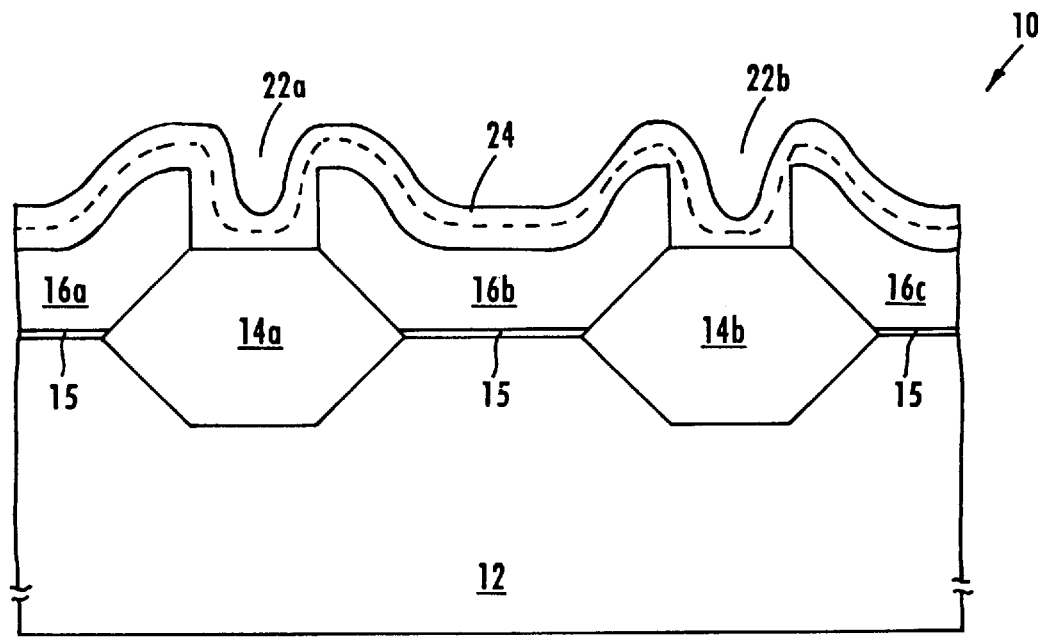

FIG. 2c depicts the portion 10 of FIG. 2b following deposition of interpoly dielectric layer 24 over floating gates 16a–c and within spaces 22a and 22b (see FIG. 2b). In certain preferred embodiments of the present invention, interpoly dielectric layer 24 is an ONO layer. An ONO layer can be formed, for example, by a three stage process in which a first film of silicon dioxide (e.g., about 50 Angstroms thick) is deposited or grown, followed by deposition of a second film of silicon nitride (e.g., about 80 Angstroms thick), and then a third film of silicon dioxide (e.g., about 40 Angstroms thick) is deposited or grown . The ONO layer provides a thin, highly-insulative dielectric layer that separates the floating gate 16 from the control gate 26, as depicted in FIG. 2d.

Figure 2D:
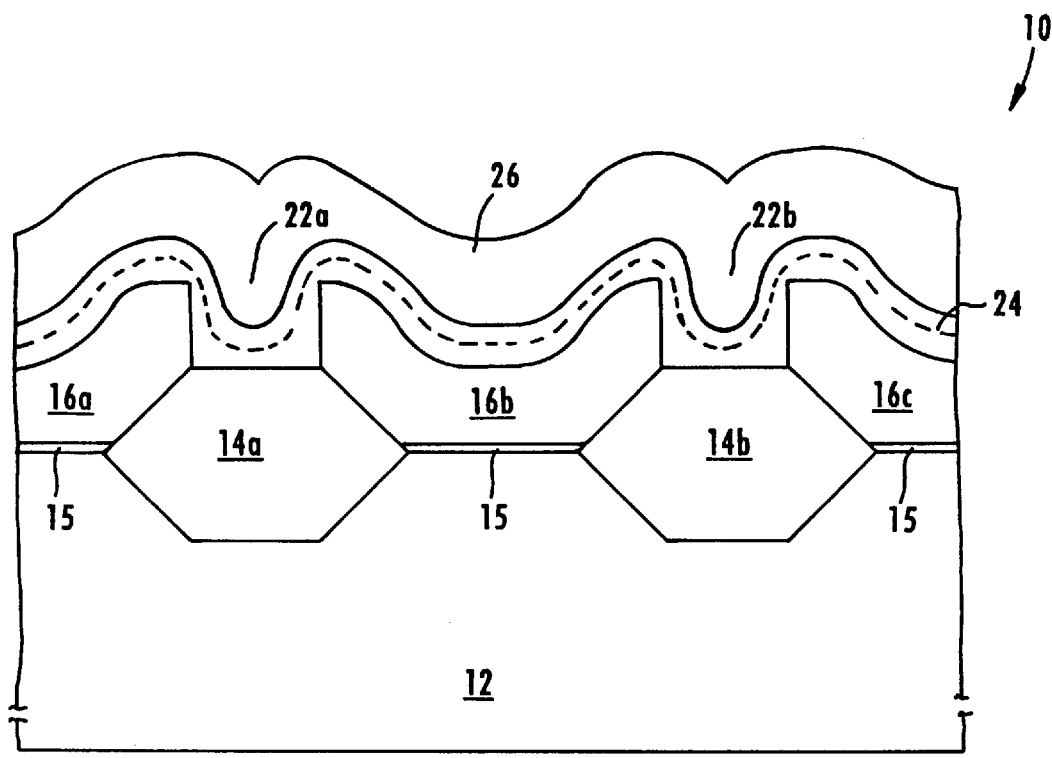
Figure 2E:
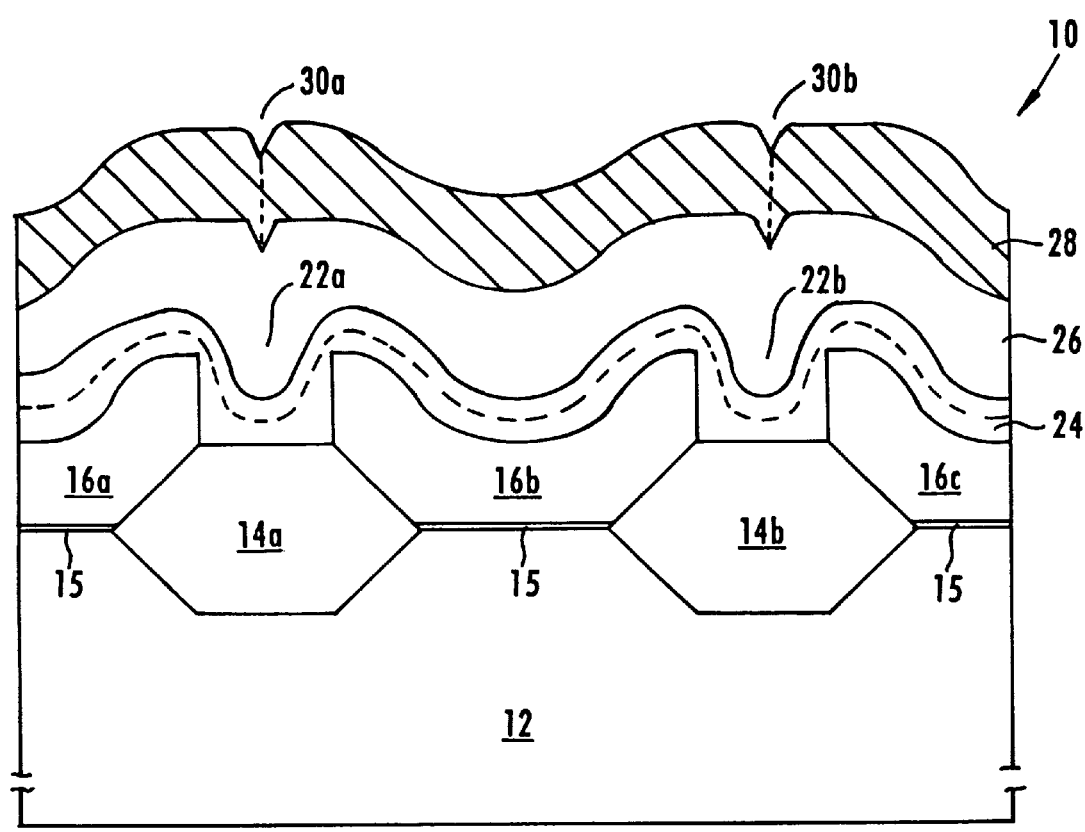

In FIG. 2d, the portion 10 of FIG. 2c has been further processed to include a conformal layer of polysilicon that is patterned to form the control gate 26. This polysilicon can be deposited to a thickness of about 1,200 Angstroms using conventional deposition techniques, such as, CVD and PECVD techniques. A suicide layer 28, for example tungsten suicide (e.g., WSi$_2$), is then formed on top of the polysilicon, as depicted in FIG. 2e. Although not visible from the word line cross-sectional perspective of FIG. 2d, the polysilicon is then selectively patterned using conventional polysilicon etching processes to form control gate 26.

Silicide layer 28 increases the conductivity of the control gate 26 and is designed to carry a significant portion of the programming current during the programming of the memory cells. It has been found, however, that silicide layer 28 can develop cracks, such as cracks 30a–30b in FIG. 2e, during subsequent thermal processing of portion 10. Cracks 30a–30b can extend partially through silicide layer 28, or in some cases can extend all the way through suicide layer 28 to control gate 26.

The cracking of silicide layer 28 appears to be caused by a combination of the severe topology of the spaces 22a–b (see FIG. 2b) and the subsequent thermal processing which typically is required to complete the manufacturing process. For example, subsequent thermal processes can include a high temperature anneal or thermal oxidation process associated with subsequent manufacturing steps. Thus, silicide layer 28, when subjected to the high temperatures of the subsequent thermal processes, tends to crack above the severe topology of the underlying layers. Cracks, such as, for example cracks 30a and 30b in FIG. 2e, tend to increase the resistance in the control gate 26 and degrade the performance of the flash memory and/or damage the semiconductor device.

It has been found that the cracking of silicide layer 28 is more prominent when the spaces 22a–b between the floating gates 16a–c are less than approximately 0.4 microns. In certain preferred embodiments of the present invention, spaces 22a–b are each approximately 0.26 microns wide, and the thickness of each of the floating gates 16a–c is approximately 900 to 1,100 Angstroms. The resulting topology has been found to cause a significant amount of cracking of suicide layer 28 during subsequent thermal processing. By way of example, in certain situations the cracking of suicide layer 28 has caused the resistance of a word line to increase by 100 times.

In accordance with certain embodiments of the present invention, the cracking of silicide layer 28 is substantially reduced, if not entirely eliminated, by tapering the sidewalls of each of the floating gates 16a–c. Tapered floating gates 36a–c, see FIG. 3, reduce the severity of the topology, which in turn alters the shapes of the overlying layers deposited over and above spaces 22a–b. This allows for increased step coverage when forming control gate 26 and silicide layer 28.

Figure 3:
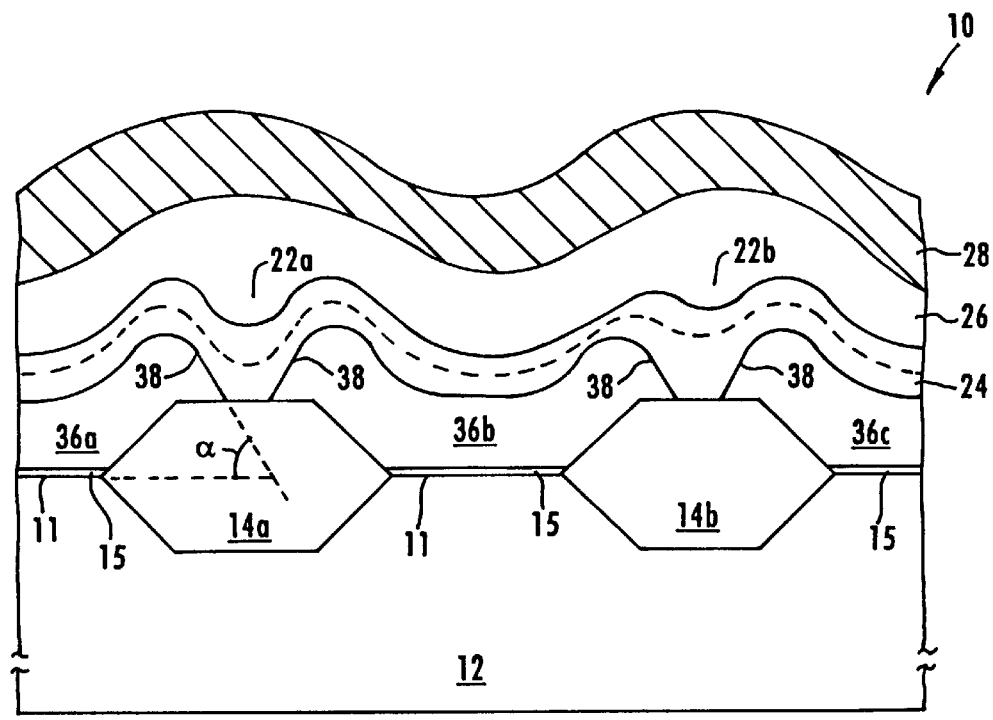
FIG. 3 depicts a cross-sectional view of a portion of a semiconductor device having a plurality of memory cells having floating gates with tapered sidewalls that prevent cracking of the silicide layer on the control gate, in accordance with certain embodiments of the present invention.

By way of example, FIG. 3 depicts one embodiment of the present invention in which the portion 10 has been modified during fabrication to include tapered floating gates 36a–c. Tapered floating gates 36a–c, in certain embodiments, are formed (at least partially over the isolating regions 14a–b) by depositing polysilicon layer 16 to a thickness of about 900 to 1,100 Angstroms, forming a mask 18 (see FIG. 2a) on the polysilicon layer 16, and isotropically etching through the exposed regions of polysilicon layer 16 such that sidewalls 38 of tapered floating gates 36a–c are sloped and project partially into spaces 22a–b, as applicable.

The range of acceptable slopes for the sidewalls 38 of tapered floating gates 36a–c is dependent upon the width of spaces 22a and 22b, and the thickness of polysilicon layer 16. Regardless of the dimensions of these elements, the angle ($\alpha$) of the slope cannot be so low that adjacent tapered floating gates actually contact each other. Conversely, the angle of the slope cannot be so high that the topology is left essentially unaltered.

Figure 4:
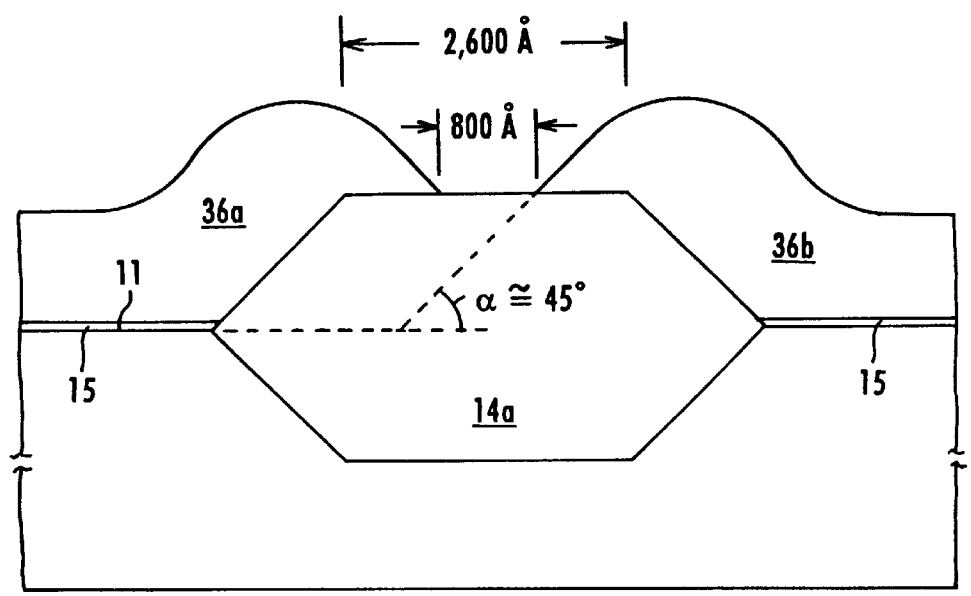
FIG. 4 depicts a cross-sectional view of a portion of a semiconductor having tapered sidewalls, as in FIG. 3, in accordance with an embodiment of the present invention.

In accordance with certain embodiments of the present invention, for example as depicted in FIG. 4, the width of spaces 22a–b is approximately 2,600 Angstroms (as measured at the top of the space), the thickness of polysilicon layer 16 is approximately 900 Angstroms. By isotropically etching the polysilicon layer 16, the resulting sidewalls 38 form an approximate angle of about a 45° (when projected to the top surface 11), such that each of the sidewalls 38 extend inwardly into their respective adjacent spaces (e.g., 22a) approximately 900 Angstroms. Thus, taking into account the resulting width of sidewalls 38 from two adjacent tapered floating gates (e.g., 36a and 36b), the sloped sidewalls 34 occupy approximately 1,800 Angstroms of space 22a, thereby leaving approximately 800 Angstroms of separation between tapered floating gates 36a and 36b at the top surface of field oxide region 14a.

The above dimensions represent an exemplary embodiment of the invention, and other embodiments have different dimension and degrees of tapering within the consideration discussed earlier.

As seen in FIG. 3, the sulicide layer 28 does not exhibit the cracks 30a–b over the isolating regions (i.e. the field oxide regions 14a–b). Since cracks in the silicide layer 28 are significantly reduced or substantially eliminated, the resistance of the control gate arrangement is not deleteriously increased to any significant extent.

Although the present invention has been described and illustrated in detail, it is to be clearly understood that the same is by way of illustration and example only and is not be taken by way of limitation, the spirit and scope of the present invention being limited only by the terms of the appended claims.

What is claimed is:

1. A semiconductor device comprising:

a substrate having a top surface;

at least two isolating regions formed at least partially within the substrate, near the top surface of the substrate and separate from each other by an isolated region, each isolating region having an upper surface substantially parallel to the top surface of the substrate; and a floating gate over the substrate and a portion of at least one of the isolating regions, wherein the floating gate is formed of a single conductive layer with an upper surface forming at least one tapered sidewall having a rounded upper edge part and a planar lower edge part, the upper surface of the single conductive layer of the floating gate at the planar lower edge part intersecting the upper surface of said at least one of the isolating regions at an oblique angle.

2. The semiconductor as recited in claim 1, wherein the rounded upper edge part of the at least one tapered sidewall of the floating gate extends over at least a portion of one of the isolating regions.

3. The semiconductor device as recited in claim 2, wherein at least one of the isolating regions comprises silicon dioxide.

4. The semiconductor device as recited in claim 1, further comprising:

a dielectric layer conformally formed on the floating gate and at least a portion of each of the two isolating regions;

a control gate formed on at least a portion of the dielectric layer and at least partially located directly over at least a portion of the floating gate; and a silicide formed on at least a portion of the control gate.

5. The semiconductor device as recited in claim 4, wherein the silicide comprises tungsten.

6. The semiconductor device as recited in claim 4, wherein the dielectric layer comprises at least one dielectric material selected from a group of silicon and silicon nitride.

7. The semiconductor device as recited in claim 1, wherein the floating gate comprises polysilicon.

8. The semiconductor device as recited in claim 1, wherein the oblique angle is approximately 45° with respect to the top surface of the substrate and said at least one of the isolating regions.

9. The semiconductor device as recited in claim 1, wherein the upper surface of the single conductive layer forming said floating gate varies in height above said top surface of said substrate, the tapered sidewall of the floating gate corresponds to a portion of the upper surface from a point of maximum height above said top surface of said substrate to the intersection with said at least one of the isolating regions, and said rounded upper edged part of the tapered sidewall of the floating gate and an adjacent non-sidewall portion of said upper surface form a curved surface.

10. The semiconductor device as recited in claim 1, wherein the floating gate has a thickness of approximately 900 to 1,000 Å.

11. The semiconductor device as recited in claim 1, wherein the floating gate is formed by isotropically etching the single conductive layer.

* * * * *